United States Patent [19]

Anderson

[11] 3,787,719

[45] Jan. 22, 1974

[54] TRIAC

[75] Inventor: Thomas Alexander Anderson, London, England

[73] Assignee: Westinghouse Brake English Electric Semi-Conductors Limited, London, England

[22] Filed: Nov. 10, 1972

[21] Appl. No.: 305,577

[52] U.S. Cl. ..... 317/235 R, 317/234 N, 317/235 P, 317/235 AB, 317/235 AE

[51] Int. Cl. .......... H01l 11/10

[58] Field of Search .... 317/235 P, 235 AB, 235 AE

[56] References Cited

UNITED STATES PATENTS

| | | | |
|---|---|---|---|
| 3,696,273 | 10/1972 | Foster | 317/235 AB |
| 3,350,611 | 10/1967 | Scace | 317/235 AB |
| 3,317,746 | 5/1967 | Hutson | 317/235 AB |
| 3,504,241 | 3/1970 | Dumanevich et al. | 317/235 AB |
| 3,443,171 | 5/1969 | Knott et al. | 317/235 AB |
| 3,622,841 | 11/1971 | Zorogin | 317/235 AB |
| 3,549,961 | 12/1970 | Gault | 317/235 AB |
| 3,360,696 | 12/1967 | Neilson et al. | 317/235 AB |
| 3,391,310 | 7/1968 | Gentry | 317/235 AB |
| 3,263,139 | 7/1966 | Turner | 317/235 AB |

*Primary Examiner*—Rudolph V. Rolinec
*Assistant Examiner*—William D. Larkins
*Attorney, Agent, or Firm*—Larson, Taylor & Hinds

[57] ABSTRACT

A triac element, in plan view, has a first portion of each emitter region lying one over the other and a second portion of each emitter region spaced one from the other by a distance sufficiently greater that, in operation, carriers attempting to cross the space between the second portions re-combine before succeeding in crossing. The element has metallized contacts at least one of which is in ohmic contact with one of the emitter regions, and that contact has therein an aperture of dimensions comparable to that of the spacing between the second portions of the emitter regions and, in plan view, is located in line with those portions of the emitter regions which interconnect the first and second portions of each emitter region. There may be two such metallized contacts, one in ohmic contact with each of the emitter regions.

4 Claims, 2 Drawing Figures

TRIAC

This invention relates to semiconductor elements and, more particularly, to the well-known so-called triac elements.

The present invention provides a triac element of which in plan view of the element, a first portion of each emitter region lies one over the other and a second portion of each emitter region is spaced one from the other by a distance sufficiently great that, in operation of the element, carriers attempting to cross the space between the second portions re-combine before succeeding in so crossing; the element further having metallized contacts at least one of which is in ohmic contact with one of the emitter regions, and that contact has therein an aperture of diemensions comparable to that of the spacing between the second portions of the emitter regions and, in plan view of the element, is located in line with those portions of the emitter regions which interconnect the first and second portions of each emitter region.

The spacing between the second portions of the emitter regions (in plan view of the element) may be three diffusion lengths.

There may be two such metallized contacts as specified above, one in ohmic contact with each of the emitter regions.

That one of the emitter regions extending inwardly from the face of the element from which extends inwardly the gate region may have a body portion and a finger portion, the finger portion and a part of the body portion constituting the first portion of that emitter region. In this case, the element may be rectangular in plan view and the gate region located adjacent one corner of the element.

One embodiment of the present invention will now be described in greater detail, by way of example only, with reference to the accompanying drawings of which:

Figure 1:
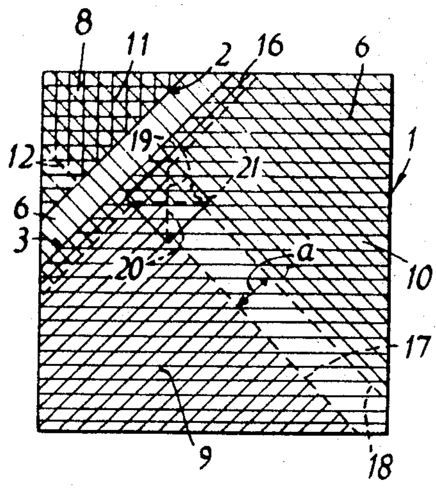
FIG. 1 is a plan view of the triac element.

Referring to the accompanying drawings, the triac element comprises a slice of semiconductor material 1 sandwiched between upper metallised contacts 2 and 3 respectively and a lower metallised contact 4.

The semiconductor slice 1 has a middle region 5 of N-type conductivity above and below which are collector/base regions 6 and 7 of P-type conductivity which extend inwardly of the slice from the top and bottom faces respectively. Extending inwardly from the top of the face of the slice 1 is a first part 8 of a gate region and a first emitter region 9 both of N-type conductivity.

Extending inwardly of the slice from the lower face thereof is a second emitter region 10 also of N-type conductivity.

In FIG. 1, the gate region 8 is that area in the top left corner which is, inter alia, hatched with vertical lines; the first emitter portion is that area hatched, inter alia, in diagonal lines extending upwardly from left to right; the first collector/base region 6 is the remainder of the area of the top face of the element 1; the second emitter 10 is that area of the bottom face of the element 1 hatched, inter alia, in diagonal lines extending upwardly from right to left; and the second collector/base region in the remainder of the area of the bottom face of the element 1.

Ohmically connected to the part 8 of the gate region 8 over its major part 11 is the metallized contact 2 but this contact 2 has a further minor part 12 which extends beyond the area of the gate region 8 to be in ohmic contact with a second part 13 of the gate region. In the FIG. 1, the metallized contact 2 is that area in the top left corner which is hatched, inter alia, with horizontal lines.

Figure 2:
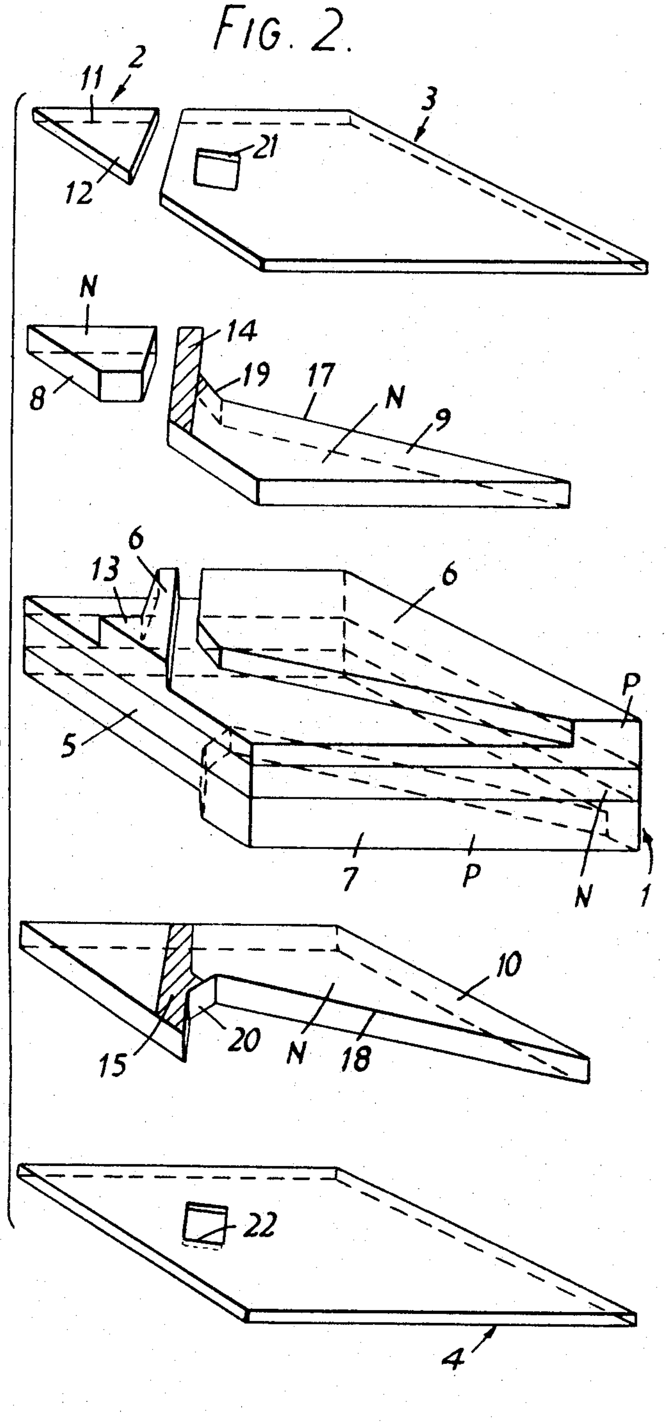
FIG. 2 is an "exploded" view of the element of FIG. 1.

As can be seen from both FIG. 1 and FIG.2, the emitter regions 9 and 10 each have a portion 14 and 15 respectively (the diagonally hatched areas in FIG. 2 and the area 16 hatched with horizontal lines, diagonal lines extending upwardly from left to right and diagonal lines extending upwardly from right to left) of which the portion 14 of the first emitter 9 overlies the portion 15 of the second emitter 10.

The emitters 9 and 10 also have second portions extending inwardly of the emitter regions 9 and 10 from their edges 17 and 18 respectively which, as can be seen most clearly from FIG. 1 are spaced apart (in plan view of the element) by a distance *a*. This distance *a* is of the order of three diffusion lengths and is a distance sufficient that, in operation of the element, carriers attempting to cross the space recombine before succeeding in so crossing.

As there are portions of the emitters 9 and 10 which lie one over the other and other portions which are spaced one from the other (in plan view of the element, it is inevitably so that between these portions of each emitter region there must be further portions lying between the first and second portions which, whilst not overlying one another are also not spaced from one another by the distance *a*. These further portions extend inwardly of their respective region 9 or 10 from the edges 19 and 20 respectively, of the regions 9 and 10. In the area of these further portions, the metallized contacts 3 and 4 are both apertured by being provided with apertures 21 and 22 respectively. As shown in the drawings, the apertures 21 and 22 are of rectangular configuration (being, in fact, of square configuration) with the sides of the apertures of a length only slightly greater than the plan view spacing *a* between the edges 17 and 18 of the emitter regions 9 and 10 respectively.

The metallized contact 3 is that area (save for the top left-hand corner) in FIG. 1 which is hatched with horizontal lines and, as can be seen, this contact 3 is ohmically connected to both the first emitter region 9 and the first collector/base region 6.

In FIG. 1, so as to avoid undue complication of the Figure, the contact 4 is not included for, as can be seen from FIG. 2, this contact extends over the whole of the lower face of the element 1 save for the aperture 22 and is ohmically connected both to the second emitter region 10 and the second collector/base region 7.

The triac above-described can be switched by either a positive or a negative signal applied to the gate region 8 through the metallized contact 2, in both directions.

With known triacs, a factor limiting their usefulness is the low permissable rate of rise of voltage in one direction after conduction in the other direction. This arises because the excess carriers which are present in the conducting half of the triac can be swept out through the other half undesirably causing it to switch. It is known that this can be avoided by separating the emitter regions by a distance (*a*) which ensures that the carriers recombine before they can pass from one half of the device to the other. Such spacing of itself is not undesirable in the case of triacs arranged to switch by means of a positive gate current in quadrant I and a negative gate current in quadrant III.

If, however, it is desired to switch the device by, at choice, a positive or a negative current in both quadrants it is necessary that the two emitter regions should have portions which, in plan view of the element, lie one over the other. If, therefore, there is need, on the one hand, to have portions of the emitters which are spaced one from the other and, on the other hand, to have portions which lie one over the other, it is inevitable that there must be intermediate portions which, whilst not lying one over the other, are also not spaced one from the other by the necessary distance. This problem has been overcome in the above-described embodiment by the omission of the metallized contact in the area of these intermediate portions i.e. by the provision of the apertures 21 and 22 in the contacts 3 and 4 of the embodiment above described. By the provisions of these apertures, it is ensured that there is little current flow through these intermediate portions.

What we claim is:

1. A triac element of which, in plan view of the element, a first portion of each emitter region lies one over the other and a second portion of each emitter region is spaced one from the other by a distance sufficiently great that, in operation of the element, carriers attempting to cross the space between the second portions recombine before succeeding in so crossing; the element further having first and second metallized contacts, said first contact being in ohmic contact with one of the emitter regions, and said first contact having therein an aperture of dimensions comparable to that of the spacing between the second portions of the emitter regions and, in plan view of the element, being located in line with those portions of the emitter regions which interconnect the first and second portions of each omitter region, said second contact being in ohmic contact with the other of said emitter regions and having an aperture therein at least a portion of which is aligned with the aperture in said first contact.

2. An element as claimed in claim 1, wherein the spacing between the second portions of the emitter regions (in plan view of the element) are three diffusion lengths.

3. An element as claimed in claim 1 wherein that one of the emitter regions extending inwardly from the face of the element from which extends inwardly the gate region, has a body portion and a finger portion, the finger portion and a part of the body portion constituting the first portion of that emitter region.

4. An element as claimed in claim 3, wherein the element is rectangular in plan view and the gate region is located adjacent one corner of the element.

* * * * *